United States Patent
Pray

(10) Patent No.: US 10,168,379 B2
(45) Date of Patent: Jan. 1, 2019

(54) FIXED IMPEDANCE CABLING FOR HIGH VOLTAGE SURGE PULSE

(71) Applicant: Robert Pray, Fort Collins, CO (US)

(72) Inventor: Robert Pray, Fort Collins, CO (US)

(73) Assignee: AKTIEBOLAGET SKF, Gothenburg (SE)

(*) Notice: Subject to any disclaimer, the term of this patent is extended or adjusted under 35 U.S.C. 154(b) by 241 days.

(21) Appl. No.: 15/137,194

(22) Filed: Apr. 25, 2016

(65) Prior Publication Data
US 2017/0307677 A1    Oct. 26, 2017

(51) Int. Cl.
| G01R 31/02 | (2006.01) |
| G01R 31/12 | (2006.01) |
| G01R 31/16 | (2006.01) |
| G01R 31/28 | (2006.01) |
| G01R 31/34 | (2006.01) |
| G01R 27/26 | (2006.01) |
| H04B 3/28 | (2006.01) |
| H01B 11/18 | (2006.01) |

(52) U.S. Cl.
CPC ......... *G01R 31/16* (2013.01); *G01R 31/1272* (2013.01); *H01B 11/18* (2013.01); *H01B 11/1891* (2013.01); *H01B 11/1895* (2013.01)

(58) Field of Classification Search
CPC ........ G01R 31/02; G01R 31/12; G01R 31/16; G01R 31/28; G01R 31/34; G01R 27/26; H01B 11/18; H04B 3/28
See application file for complete search history.

(56) References Cited

U.S. PATENT DOCUMENTS

| 4,843,515 A * | 6/1989 | Richman ................ G01R 31/00 324/509 |
| 5,608,328 A * | 3/1997 | Sanderson ........... G01R 31/085 324/133 |
| 5,831,410 A * | 11/1998 | Skibinski .................. H02J 3/01 318/434 |
| 2007/0241868 A1* | 10/2007 | Fackrell .................. B60T 7/042 340/431 |
| 2009/0134880 A1* | 5/2009 | Grund .................. G01R 31/002 324/537 |
| 2010/0097023 A1* | 4/2010 | Nakamura ............... H01B 7/30 318/400.41 |
| 2010/0219902 A1* | 9/2010 | Schutten .................. H04B 3/30 333/12 |
| 2015/0366111 A1* | 12/2015 | Yagi ........................ H02M 1/44 174/350 |

* cited by examiner

*Primary Examiner* — Neel Shah
(74) *Attorney, Agent, or Firm* — Bryan Peckjian; SKF USA Inc. Patent Dept.

(57) ABSTRACT

Described herein is a system. The system comprises an output cabling comprising an output wire and a return wire. The system also comprises a surge generator configured to provide a voltage pulse at a first rise time down the output cabling to a device under test. The output wire causes a ring at an initiation of the voltage pulse being provided by the surge generator to the device under test. The return wire is a return leg of the output cabling that is in a parallel path to the output wire and is configured to reduce or eliminate the ring.

14 Claims, 1 Drawing Sheet

Schematic 100

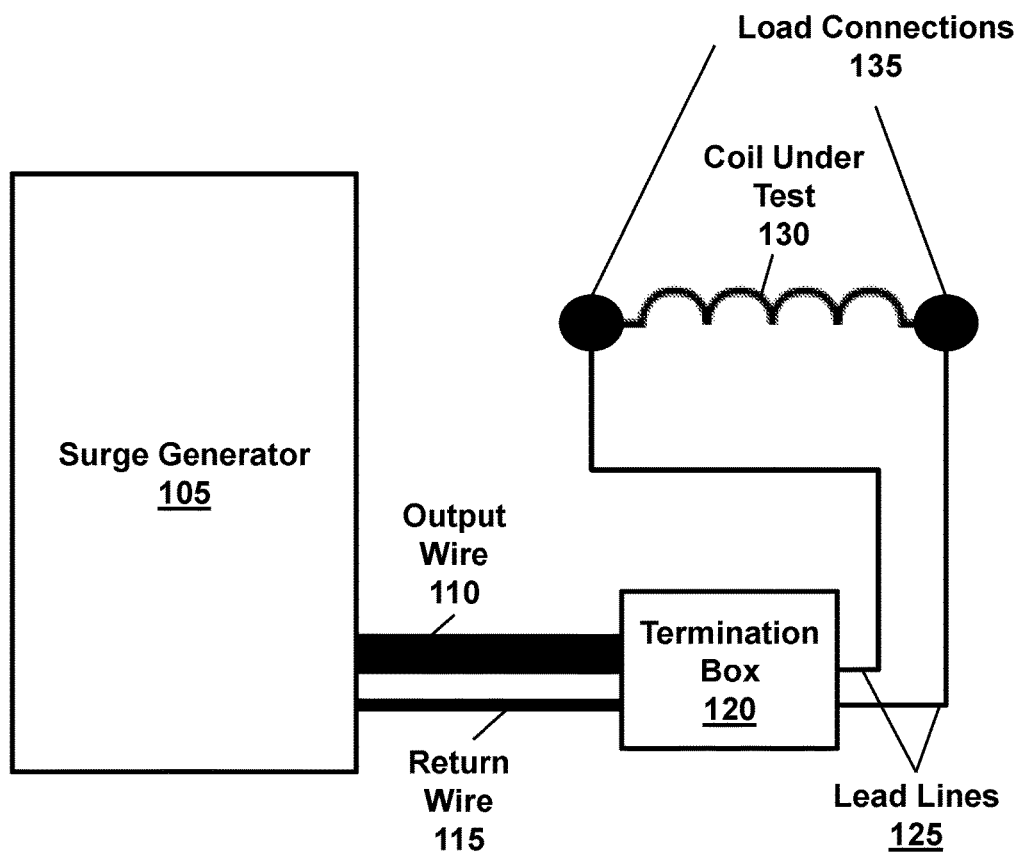

FIXED IMPEDANCE CABLING FOR HIGH VOLTAGE SURGE PULSE

BACKGROUND

Output cabling of a high voltage surge tester of coils is critical in maintaining a slope of a leading edge of a surge waveform over distances of more than a few feet. When using discreet wiring with high voltage insulation for the output cabling, a potential for a significant change to mutual inductance of the discreet wiring exists (particular, when transmitting a fast rise time into an inductive load, such as the coils). Yet, because the high voltage surge tester does not employ any impedance matching network (between the high voltage surge tester and the coils), a current oscillation in contemporary implementations of the output cabling can occur that will change the slope on the surge waveform. This change in the slope causes difficulties in maintaining rise times. In turn, test leads of the high voltage surge tester must also be kept short.

SUMMARY

Described herein is a system. The system comprises an output cabling comprising an output wire and a return wire. The system also comprises a surge generator configured to provide a voltage pulse at a first rise time down the output cabling to a device under test. The output wire causes a ring at an initiation of the voltage pulse being provided by the surge generator to the device under test. The return wire is a return leg of the output cabling that is in a parallel path to the output wire and is configured to reduce or eliminate the ring.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter described herein is particularly pointed out and distinctly claimed in the claims at the conclusion of the specification. The foregoing and other features, and advantages of the embodiments herein are apparent from the following detailed description taken in conjunction with the accompanying drawings in which:

FIG. 1 is a schematic for fixed impedance cabling according to an embodiment.

DETAILED DESCRIPTION

Embodiments described herein relate to adding an additional conductor to an output cabling of a high voltage surge tester. In general, the high voltage surge tester has a very fast voltage rise time for testing devices (e.g., motors/windings/coils under test). This voltage rise time is applied by the high voltage surge tester to reduce a peak testing voltage applied to the devices, because damage or failure of the devices (such as damage to a winding insulation) may occur if the test voltages are too high due to long rise times. The additional conductor reduces the voltage rise times.

Turning now to FIG. 1, a schematic 100 for fixed impedance cabling is generally shown in accordance with an embodiment. The schematic 100 includes a surge generator 105, an output wire 110, a return wire 115, a termination box 120, lead lines 125, a coil under test 130, and load connections 135.

The surge generator 105 provides surge waveforms (e.g., pulses) to the coil under test 130. For example, the surge generator 105 can provide/deliver 1500 amps of current for up to 10 microsecond pulses to the coil under test 130. The surge generator 105 can provide the surge waveform with a very fast rise time. To achieve the very fast rise time, a fixed impedance cabling (herein referred to as output cabling) must be short; however, the output cabling must be long enough to connect the surge generator 105 to the coil under test 130. The output cabling is the combination of the output wire 110, the return wire 115, the termination box 120, and the lead lines 125. Generally, the output cabling is less than or equal to 15 feet. The surge generator 105 can be any high voltage surge tester, such as a 40 kV power pack. For example, the 40 kV power pack can have a very fast voltage rise time from 0 to 40 kV (e.g., 10% to 90%) in less than or equal to 200 nanoseconds.

The output wire 110 can be a coaxial cable, a high voltage coaxial cable, a low mutual inductive cable system, or a mutual inductive wiring. The output wire 110 can include a high voltage insulation and a shield. In an embodiment, output wire 110 can generally include 75 picofarads of capacitance per foot. The output wire 110 can cause a ring at the initiation of a pulse being sent down the output wire 110 by the surge generator 105. For example, a parasitic capacitance of the output wire and a low mutual inductance of the output wire (e.g., coaxial cable) causes the ring at the initiation of the voltage.

The return wire 115 is a return leg of the output cabling that is configured to maintain a slope of a leading edge of a surge waveform. For instance, the return wire 115 reduces the rise time (e.g., by approximately 10%) when testing a low inductive coil as the coil under test 130. An example of the return wire 115 is a 14 gauge insulated wire. The return wire 115 can be parallel to the output wire 110 (e.g., a return leg of the output cabling is in the parallel path to a shield of the output wire). The return wire 115 can be grounded. In an embodiment, the return wire 115 is fed through the shield of the output wire 110 from the termination box 120 to the surge generator 105. The return wire 115 and the shield of the output wire 110 can have the same potential. The return wire 115, in the parallel path, prevents/reduces a current oscillation at a point of a current. A majority (e.g., greater than >75%) of the current can still be returned through the shield of the output wire 110, thereby maintaining a low mutual inductance benefits of the output wire 110. Note that the mutual inductance is where a magnetic field generated by output wire 110 induces a voltage in adjacent cabling.

The termination box 120 and the lead lines 125 operate to connect the output wire 110 of the surge generator 105 to the coil under test 130. For instance, the lead lines 125 provide maneuverability to connect to the load connections 135 of the coil under test 130. An example length of the lead lines 115 is three feet. The coil under test 130 can be any device, motor, coil, or winding being tested by the surge generator 105.

Technical effects and benefits include, but are not limited to, preventing/reducing a current oscillation at the point voltage is applied and reducing the rise time.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The invention claimed is:

1. A system, comprising:
    an output cabling comprising an output wire and a return wire;
    a surge generator configured to provide a voltage pulse at a first rise time down the output cabling to a device under test; and
    wherein the output wire causes a ring at an initiation of the voltage pulse being provided by the surge generator to the device under test,
    wherein the return wire is a return leg of the output cabling that is in a parallel path to the output wire and is configured to reduce or eliminate the ring,
    wherein the return wire reduces the first rise time to a second rise time, and
    wherein a potential of the return wire is the same as a potential of a component of the output wire.

2. The system of claim 1, wherein a parasitic capacitance of the output wire and a low mutual inductance of the output wire causes the ring at the initiation of the voltage.

3. The system of claim 1, wherein the return leg of the output cabling is in the parallel path to a shield of the output wire.

4. The system of claim 1, wherein the first rise time from 0 to 40 kV occurs in less than or equal to 200 nanoseconds.

5. The system of claim 1, wherein the output wire is a high voltage coaxial cable, low mutual inductive cable system, or mutual inductive wiring.

6. The system of claim 1, wherein the output wire comprises a shield and the return wire is fed through the shield from a termination box to the surge generator.

7. The system of claim 1, wherein the return wire is a 14 gauge insulated wire.

8. The system of claim 1, wherein the return wire is grounded.

9. The system of claim 1, wherein the component of the output wire comprises a shield of the output wire.

10. The system of claim 1, wherein the return wire in the parallel path reduces a current oscillation at a point of a current.

11. The system of claim 1, wherein a majority of a current is returned through a shield of the output wire to maintaining a low mutual inductance.

12. The system of claim 1, wherein the second rise time is at least 10% lower than the first rise time.

13. The system of claim 1, wherein the output cabling comprising a termination box and lead lines.

14. The system of claim 1, wherein the device under test is a winding of a motor.

* * * * *